United States Patent
Matsunami

(10) Patent No.: US 6,872,593 B2
(45) Date of Patent: Mar. 29, 2005

(54) VERTICAL MOLD DIE PRESS MACHINE

(75) Inventor: Akira Matsunami, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/802,952

(22) Filed: Mar. 16, 2004

(65) Prior Publication Data

US 2004/0175865 A1 Sep. 9, 2004

Related U.S. Application Data

(62) Division of application No. 10/225,425, filed on Aug. 22, 2002.

(51) Int. Cl.[7] .................... H01L 21/44; H01L 21/48; H01L 21/50

(52) U.S. Cl. .................... 438/106; 438/112; 438/124; 438/127

(58) Field of Search ........................... 438/112

(56) References Cited

U.S. PATENT DOCUMENTS

| 4,480,975 A | * 11/1984 | Plummer et al. ............ 425/116 |
| 4,872,825 A | * 10/1989 | Ross .......................... 425/117 |
| 5,910,010 A | * 6/1999 | Nishizawa et al. ........... 438/15 |

* cited by examiner

Primary Examiner—John F. Niebling
Assistant Examiner—Angel Roman
(74) Attorney, Agent, or Firm—W. James Brady, III; Frederick J. Telecky, Jr.

(57) ABSTRACT

A die mold machine for molding a plurality of semiconductor assemblies on multiple substrate/leadframes includes a plurality of die mold layers stacked vertically one above the other to form a plurality of die mold sections. The top die mold layer has at least one aperture or die hall in the top most die layer and apertures or die halls in the in-between layers for passing molding compound which flows through the die hall in the top layer down through the die halls or apertures between the die mold layers into the die mold sections for molding semiconductor assemblies on said substrate/leadframes between said die mold layers.

2 Claims, 8 Drawing Sheets

VERTICAL MOLD DIE PRESS MACHINE

This is a division of application Ser. No. 10/225,425, filed Aug. 22, 2002, the entire disclosure of which is hereby incorporated by reference.

FIELD OF INVENTION

This invention relates to semiconductor manufacturing and more particularly to a vertical mold press die machine for encapsulating a semiconductor assembly comprising a semiconductor chip on a substrate/leadframe and wire bonds or other connecting means to connect contacts on the chip to leads on the substrate/leadframe.

BACKGROUND OF INVENTION

In the process of manufacturing semiconductor devices the usable chips cut or diced from the wafer are bonded to substrates/leadframe. Bond wires or other connecting means are connected between contacts on the chip and lead lines on the substrate/leadframe to form a semiconductor assembly. This semiconductor assembly of semiconductor chip, bond wires or other connecting means and the substrate/leadframe leads closest to the chip are encapsulated in a plastic mold compound using a mold press die machine as illustrated in FIG. 1. FIG. 1 illustrates encapsulating the semiconductor assembly 12 of chip, bond wires and substrate/leadframe leads closest to the chip. Sometimes the underside of the substrate/leadframe is not encapsulated to allow the bottom to be heat sinked. The molded semiconductor assembly 12 is then trimmed to form the finished devices.

A current mold press die machine in order to increase production is made large in size with a broad planar surface to handle multiple substrate/leadframes as illustrated by FIGS. 2–4. This current mold press die machine 10 has an upper mold die half 11 and a lower mold die half 13. FIG. 2 illustrates a front vertical view of the current planar mold die machine 10 and FIG. 3 illustrates a side vertical view of the current planar mold die machine 10. FIG. 4 illustrates a plan view of the inner (under) surface 11a of the molding die half 11 to show the mold. The inner upper mold die half 11 of the die machine 10 has four substrate/leadframe molding die sections 15–18 for molding four substrate/leadframes 101–104 simultaneously. Each of the sections 15–18 has three recesses or molding pockets 14 surrounded by a frame mold 24 for receiving and encapsulating three semiconductor assemblies 12 therein as described above wherein the assemblies include the chip, bond wires and chip adjacent portion lead wires on substrate/leadframes 101–104. FIG. 2 illustrates the front molding die sections 15 and 16 about set of substrate/leadframes represented by 101 and 102. FIG. 3 illustrates the side sections 16 and 18 above assemblies 12 on substrate/leadframes represented by 102 and 104. Although not shown in FIG. 4 but shown in FIGS. 2 and 3 there are through the upper die half 11 die halls or apertures 19 through the die half 11 at each assembly 12 location (at the pockets 14) to pass heated plastic mold compound 20 into mold die machine 10 to at the pockets 14 to, when the halves 11 and 13 are pressed, mold and encapsulate the semiconductor assembly 12 on the substrate/leadframes 101–104. This machine 10 includes multiple (twelve) push rods (one above each pocket 14 for pushing the compound 20 through the die halls or apertures 19 in the die half 11 into the mold die 10. The molding compound 20 under pressure from the press rods flows into the pockets 14 and over the semiconductor assemblies 12. The top surface of the lower die half 13 may also contain the molding frame 25 with pockets 14 to form the lower part of the encapsulation of the assemblies 12.

FIG. 5 illustrates a current mold press die machine with a single press rod 21 for all four molding sections 15–18 by a single die hall or center runner opening 19 centered in the die half 11 and by branching runners or channels 22 from the center runner 19 to the twelve pockets 14 for providing the forms for the encapsulation of the assemblies 12 on the substrate/leadframes 101–104. The branching runners 22 are grooved channels in the die half 11. In the case of symmetrical molding (above and below the substrate/leadframe) of the assemblies 12 the top surface of the die half 13 also has similar pockets 14 and runners 22. The arrows represent the flow of the mold compound 20. To perform encapsulation of multiple assemblies on multiple substrate/leadframes in a plane as shown in FIG. 5 takes a large pressure.

It is desirable to provide a mold press die machine that that handles multiple/lead frames that takes up less space and requires less pressure.

SUMMARY OF INVENTION

In accordance with one embodiment of the present invention a new vertical mold press die machine is provided that has better utilization of space by providing multiple level mold die with the mold die being layered vertically and providing feed through die halls in the central die mold layers for mold compound to flow through to the lower mold die layer.

In accordance with an embodiment of the present invention a method of encapsulating multiple semiconductor assemblies on multiple substrates/leadframes includes the steps of providing vertically stacked molding die layers stacked one above the other with die halls through the die layers and a die hall in a top die layer and flowing molding compound through from the die hall in the top die layer 1 and through the intermediate die layers into to the lowest die layer.

DESCRIPTION OF PREFERRED EMBODIMENTS OF THE PRESENT INVENTION

Figure 1:
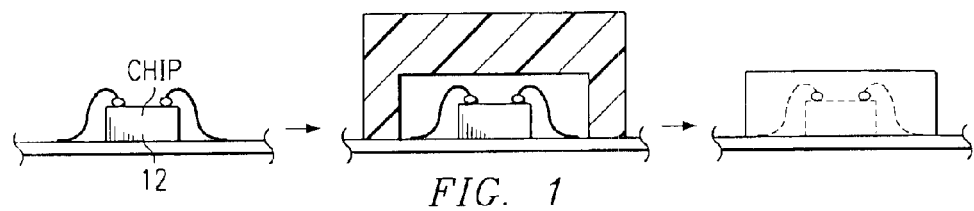
FIG. 1 illustrates a sequence of a semiconductor assembly on a substrate/leadframe with bond wires being encapsulated in a mold die.
Figure 7:
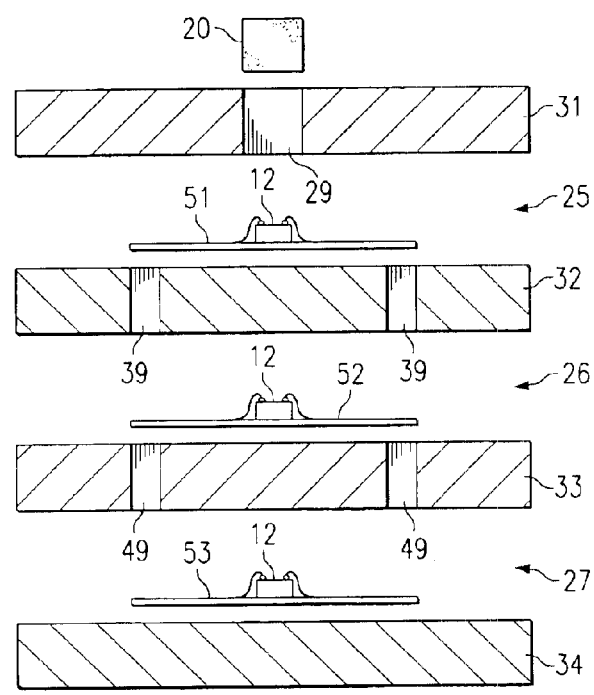
FIG. 7 illustrates the side view of the vertical mold die according to one embodiment of the present invention.
Figure 8:
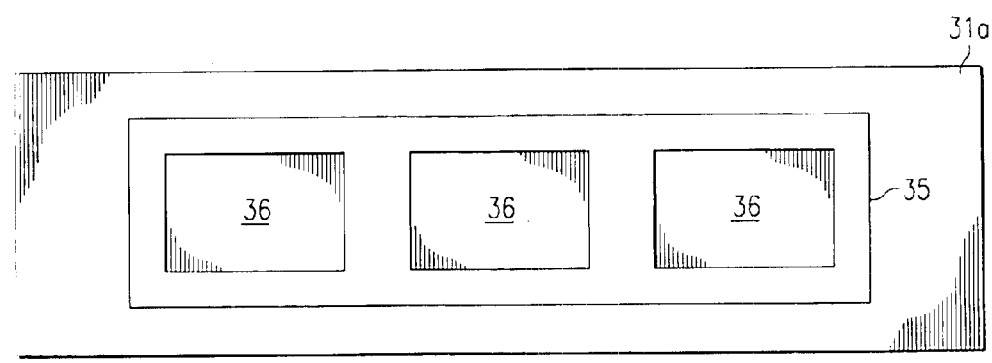
FIG. 8 illustrates a top view of the vertical mold die according to one embodiment of the present invention.
Figure 2:
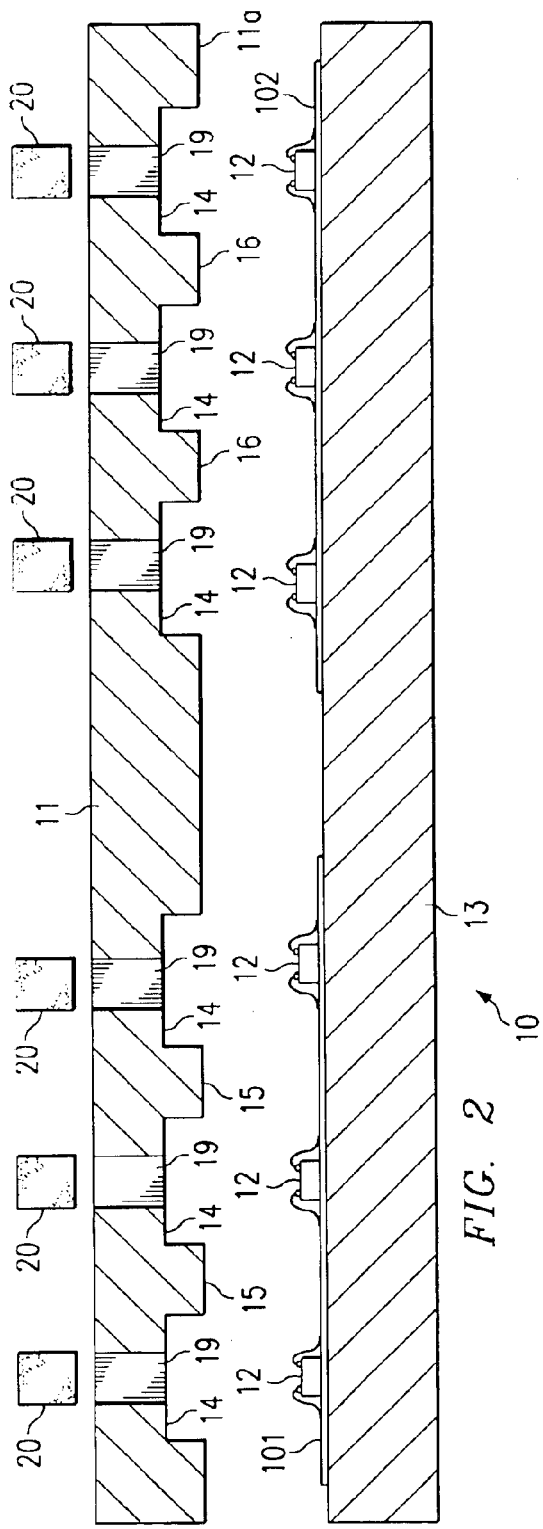
FIG. 2 illustrates a front vertical view of the current plane level mold die machine.
Figure 3:
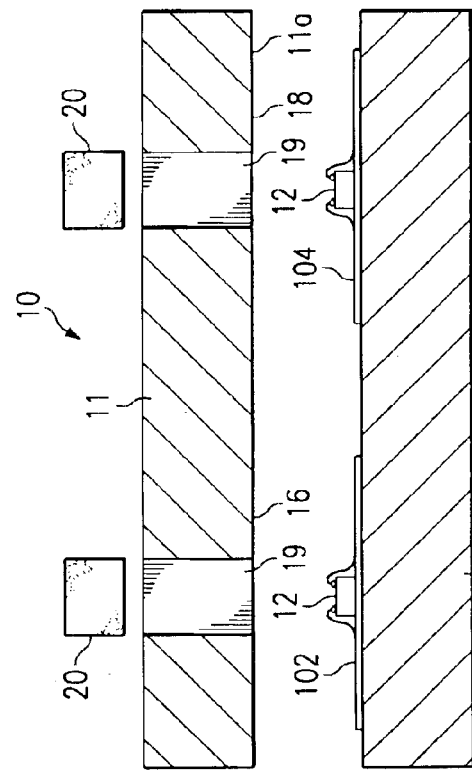
FIG. 3 illustrates a side view of a current plane level mold die machine of FIG. 2.
Figure 4:
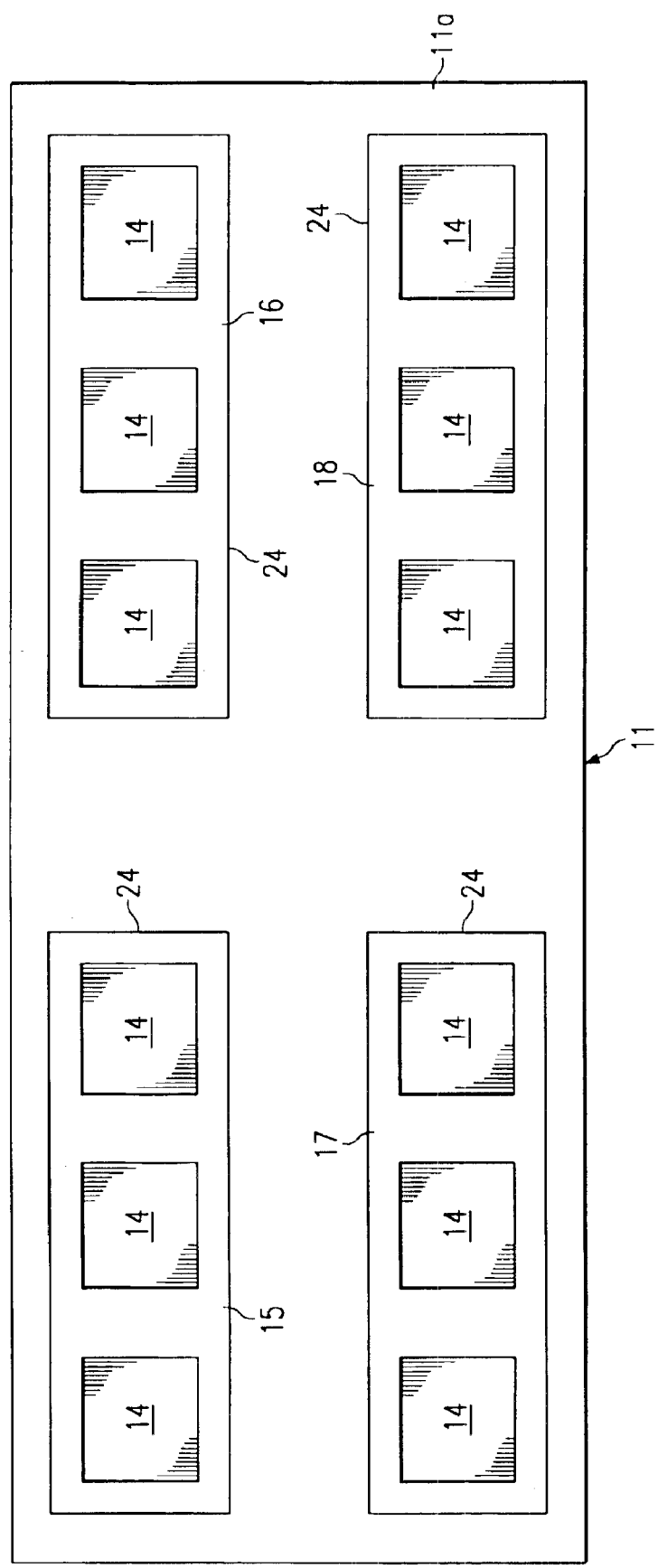
FIG. 4 illustrates an underside view of the top die half of the current plane level mold die of FIG. 2.
Figure 5:
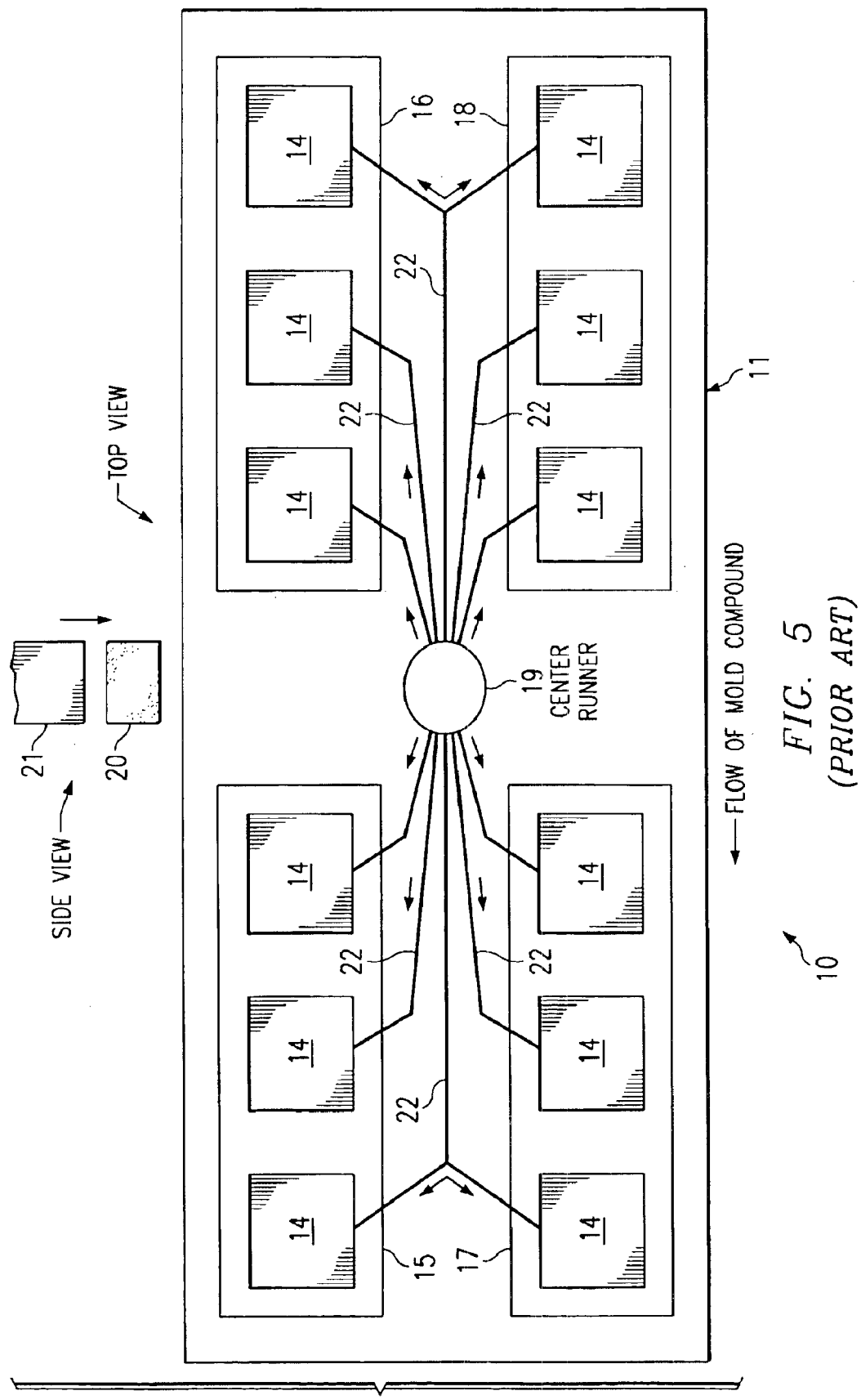
FIG. 5 illustrates a prior art mold compound flow on a mold press die.
Figure 6:
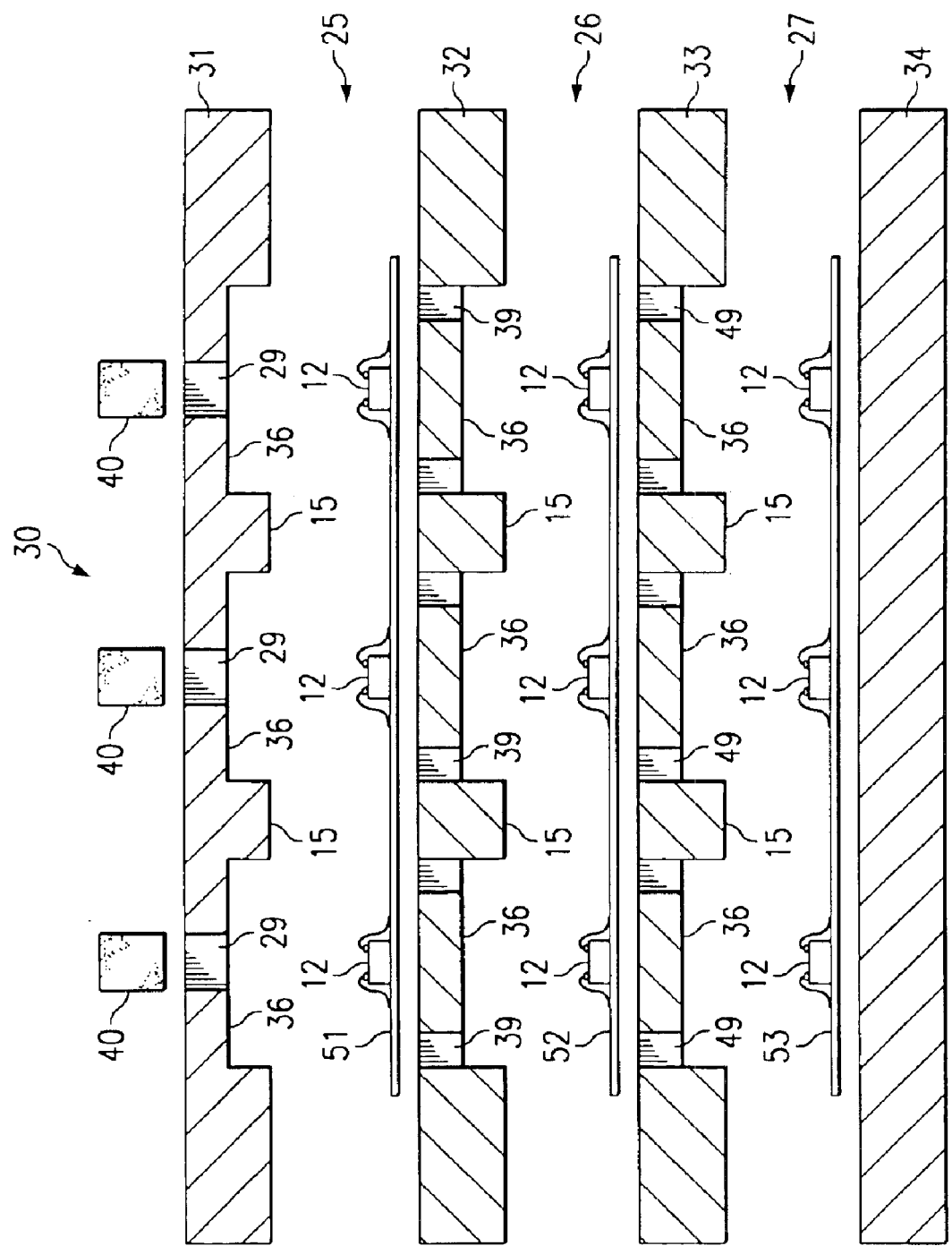
FIG. 6 illustrates a vertical view of the vertical mold die according to one embodiment of the present invention.

Referring to FIGS. 6–8 there is illustrated the vertical mold die 30 according to one embodiment of the present invention. FIG. 6 illustrates the front view of the vertical mode die machine 30 showing multi-level die mold sections 25–27. FIG. 7 illustrates the side view of the vertical mold die machine showing the layered multi-level sections 25–27. The vertical mold die comprises vertical mold die layers 31–34 with a top die layer 31, a second die layer 32 layered under the top die layer 31, a third die layer 33 layered under the second die layer 32 and a bottom die layer 34 layered under the third die layer 33. In this example there are three substrate/leadframes 51–53 with each substrate/leadframe having three semiconductor assemblies 12 to be encapsulated between the mold die layers 31–34. The three semiconductor assemblies 12 on substrate/leadframe 51 are encapsulated by the die section 25 formed between the bottom surface the top die mold layer 31 and the top surface of the second die layer 32. The three semiconductor assemblies 12 on substrate/leadframe 52 are encapsulated by the die section 26 formed between the bottom surface the intermediate die mold layer 32 and the top surface of the intermediate die layer 33. The three semiconductor assemblies 12 on substrate/leadframe 53 are encapsulated by the die section 27 formed between the bottom surface the intermediate die mold layer 33 and the top surface of the bottom die layer 34.

The bottom surface of layer 31 contains the pockets 36 or recesses to provide the forms for retaining the mold compound to form the encapsulation over the assemblies 12 as illustrated in FIG. 8. The top wall of layer 32 may likewise contain pockets (not shown) for encapsulating under the assembly 12. The bottom surface of layer 32 contains the pockets 36 or recesses to provide the forms for retaining the mold compound to form the encapsulation over the assemblies 12. The top wall of layer 33 may likewise contain pockets (not shown) for encapsulating under the assembly 12. The bottom surface of layer 33 contains the pockets 36 or recesses to provide the forms for retaining the mold compound to form the encapsulation over the assemblies 12. The top wall of layer 34 may likewise contain pockets (not shown) for encapsulating under the assembly.

As illustrated in FIGS. 6 and 7 the top die layer 31 has three die halls 29 for passing the mold compound 40 into the vertical mold die machine 30. These die halls 29 are right above the pockets 36 for forming the encapsulation over the assemblies 12 on the substrates/leadframes 51–53. The die halls 29 are not illustrated in FIG. 8. Twelve smaller die halls or apertures 39 are in the second die layer 32 with four die halls into each pocket 36. Twelve die halls 49 are in the third die part 33 with four die halls into each pocket 36.

Figure 9:
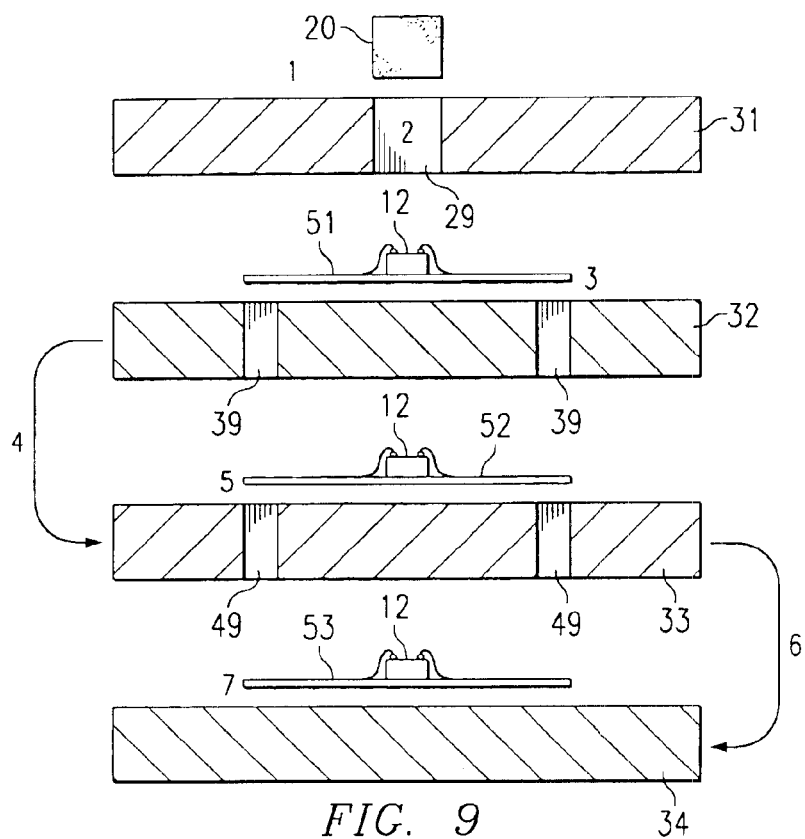
FIG. 9 illustrates the operation of the vertical mold die apparatus according to the present invention.

FIG. 9 illustrates the operation of the vertical mold die apparatus according to the present invention. The mold compound at step 1 is pressed in step 2 by a press rod through the top die halls 29 through the top die layer 31 to fill pockets 36 of the first layer 31 of the mold for the first stage to form first set of three encapsulations of assemblies 12 on substrate/leadframes 51 at step 3. As the mold compound is pressed further by the push rod in step 3, the mold compound flows through the six die halls 39 in the second die layer 32 to the second stage to fill the mold pockets for the second set of three assemblies on substrate/leadframes 52 in step 5. As the mold compound is further pressed by the push rod in step 6, the mold compound is further flowed through the six die halls 49 in the third die layer 33 to the third stage to fill the mold pockets for the encapsulation of the three assemblies 12 on the third leadframes/leadframes 53.

Figure 10:
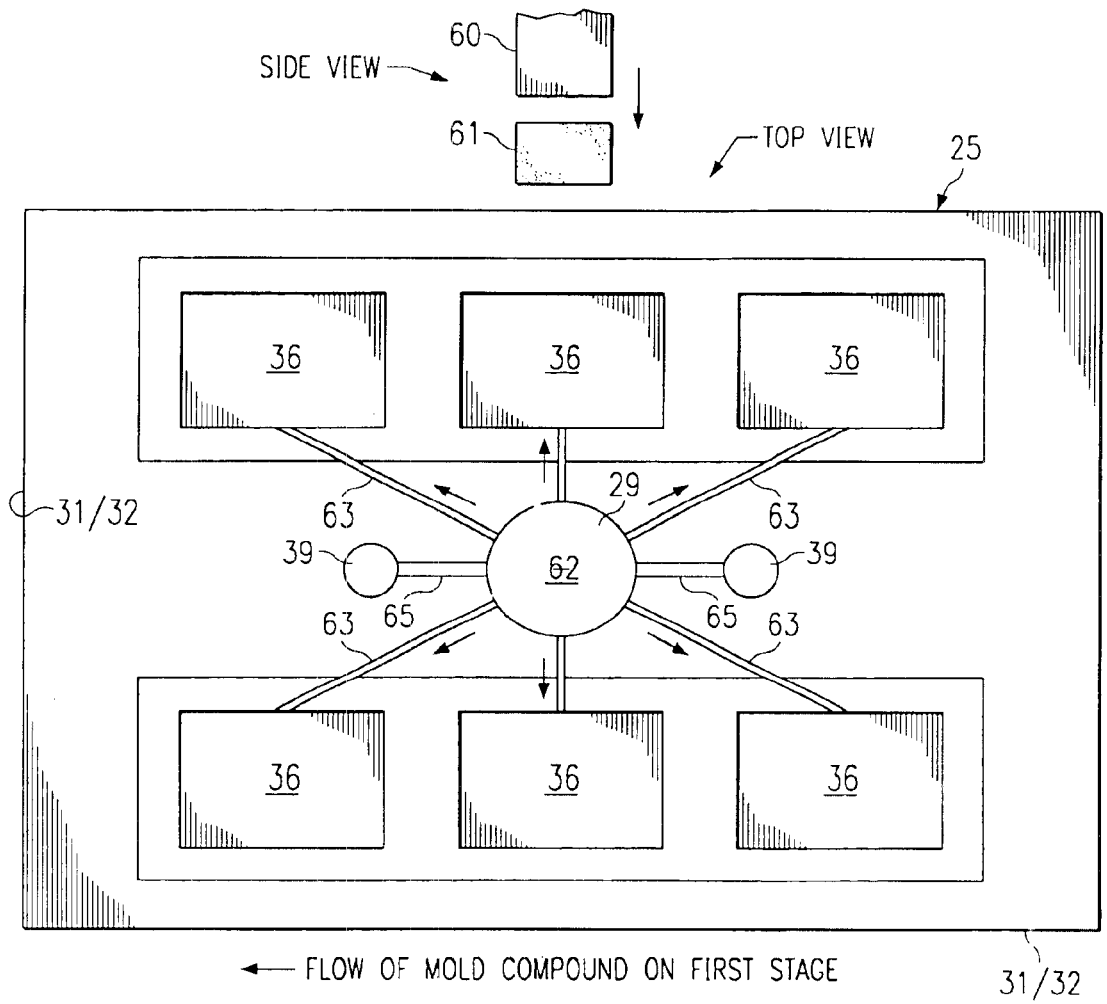
FIG. 10 illustrates the first level vertical mold compound flow on the mold press die according to the present invention.
Figure 11:
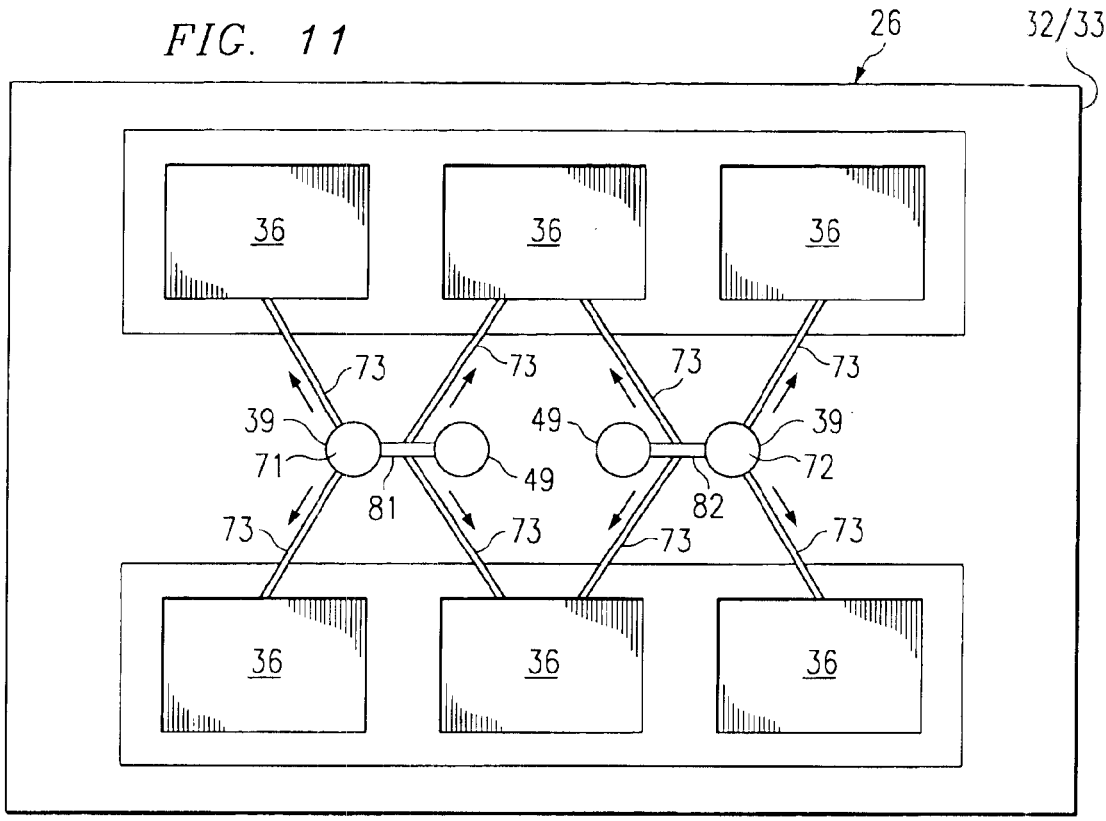
FIG. 11 illustrates the second level vertical mold compound flow on the mold press die according to the present invention.
Figure 12:
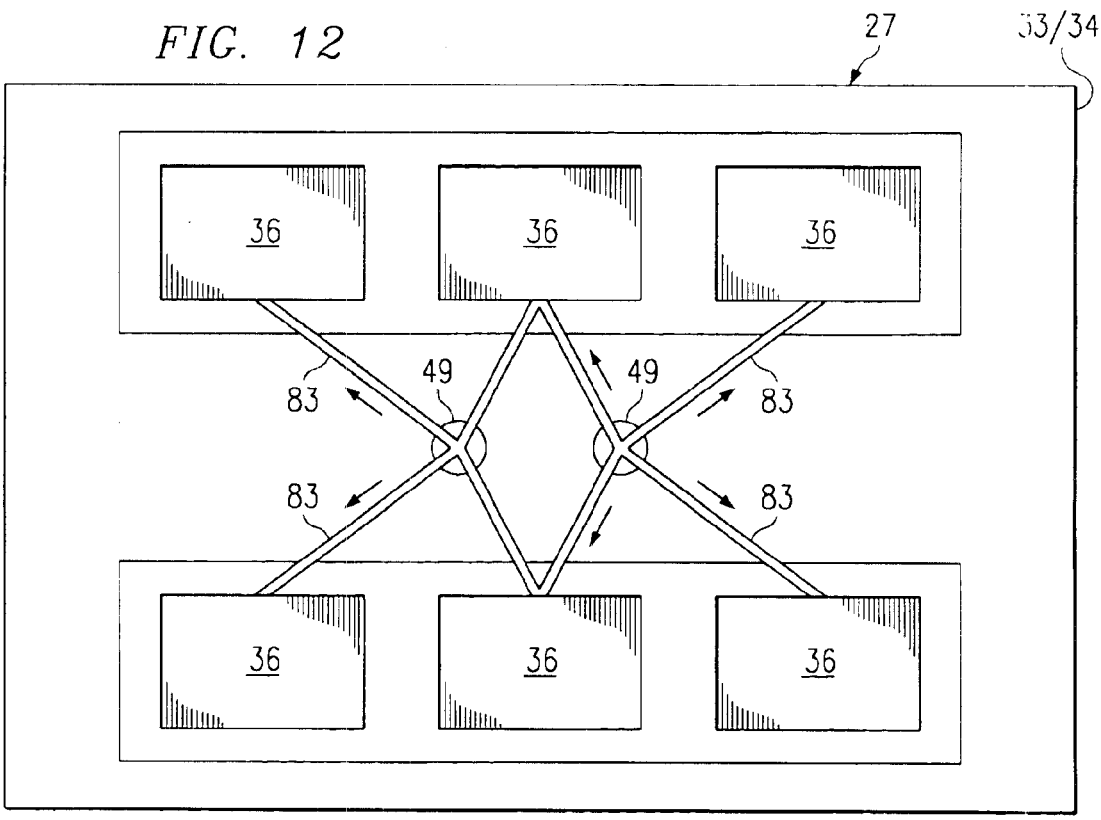
FIG. 12 illustrates the third level vertical mold compound flow on the mold press die according to the present invention.

FIGS. 10–12 illustrate the vertical mold compound flow on the mold press die according to another embodiment of the present invention wherein there is one central die hall 29 in the top layer 31 and the layers 31–34 each include six molding pockets 36 and runners or channels distributing the mold compound. The operation follows the flow of FIG. 9. In the example two rows of substrate/leadframes are having their assemblies 12 encapsulated at the same time with the same mold compound. FIG. 10 illustrates the first level 25. The press rod 60 presses the heated mold compound 61 through the center runner 62 in the first level mold die section 25 below a central die hall 29 in die layer 31 and then along the branching runners or channels 63 to the molding pockets 36 for the six assemblies 12 (three per row and two rows) on substrate/leadframes 51. The molding pockets 36 and the runners or channels 63 are for example in the bottom of the top die layer 31 and the top of the intermediate die layer 32. On either side of the center runner 62 is a runner 65 to the die halls 39 through the second die layer 32.

FIG. 11 illustrates the second level 26 mold die wherein there are two center runners 71 and 72 under the die halls 39 in the second die layer 32 that pass or channel the mold compound using feed branching runners 73 to the six molding pockets 36 for the six assemblies on substrate/leadframe 53 in the second section or level 26. On one side of the center runners 71 is a runner 81 to die hall 49 in layer 33 and on one side of center runner 72 is a runner 82 to die hall 49 in layer 33. The third level 27 has branching runners 83 in layers 33 and 34 extending from the die halls 49 in the third die layer 33 to pass the mold compound to the six molding pockets 36 for the third level mold 27 as illustrated in FIG. 11.

In accordance with the present invention by using the vertical mold die machine with multiple layers the mold press die mold compound flows down from the top through the die layers to perform encapsulation of assemblies on multiple substrate/leadframes at the same time. The mold press die is more compact with the intermediate die layer parts 32 and 33 each being used for molding on two substrate/leadframes at the same time and using less pressure since the flow is downward and between substrate/leadframes.

Figure 13:
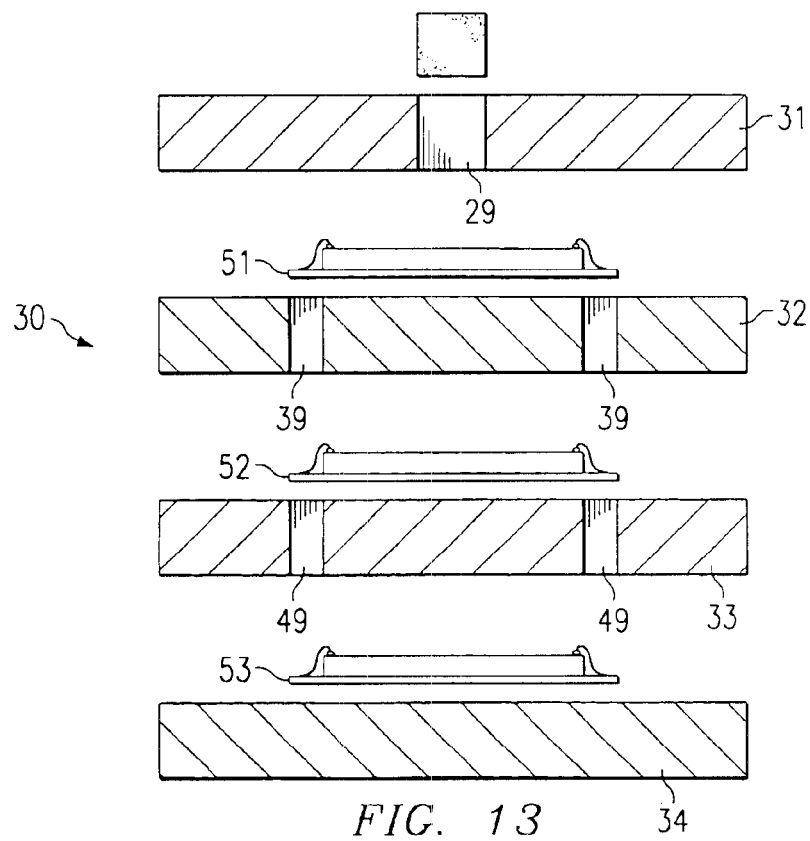
FIG. 13 illustrates three encapsulated assemblies in the multi-level vertical mold die according to the present invention.

While the above description and FIGS. 6–12 illustrates a machine with the die mold layers, a push rod and mold compound there is much more to the machine. The mold press die machine 30 includes means to receive multiple layers of substrate/leadframe strips 51–53 in parallel having assemblies 12 thereon and encapsulate them in the mold die machine 30 simultaneously (illustrated in FIG. 13) with the machine automatically opening the die mold sections 25–27 to receive substrate/leadframe the strips, feeding the substrate/leadframe strips into the mold die machine 30, providing the controlled amount of properly heated mold compound, activating a push rod 60 to press the mold compound to encapsulate the assemblies 12, to open the mold and removing the molded substrate/leadframe strips under program control. The molded assemblies 12 are then trimmed and tested.

Although the die frames and pockets are sometime illustrated in the top wall of the die sections the molding frames and pockets may be in the bottom wall or be in both the top wall and bottom wall of the die section.

Thus it is apparent that there is provided, in accordance with the present invention, an improved mold press die apparatus is provided. Although the present invention has been described in detail, it should be understood that various changes, substitutions, and alterations might be made herein. Other examples are readily ascertainable by one skilled in the art and may be made without departing from the spirit and scope of the present invention as defined by the following claims.

What is claimed is:

1. A method of separately molding a plurality of semiconductor assemblies on separate multiple semiconductor substrates/leadframes comprising the steps of:

providing vertically stacked molding die layers stacked one above the other to form vertically stacked die mold sections between said die layers for completely molding separate multiple semiconductor assemblies on separate substrates/leadframes in mold forming pockets in said die layers, said die layers having at least one top layer aperture or die hall in the top most die layer to from an opening into a top die mold section and a plurality of intermediate layer apertures or die halls in intermediate die layers to form openings into lower vertically stacked die mold sections, said top die mold section having runner grooves in at least one of said top die layer or next lower die layer with a separate runner groove extending directly from each of said top layer aperture to a separate one of said mold forming pockets in the top die mold section and said lower die sections having runner grooves in at least one of said die layers with a separate runner groove extending directly from each of said intermediate layer apertures to a separate one of said mold framing pockets in the die mold section for passing molding compound through the top layer aperture along said runner grooves to the mold framing pockets in the top die section and down through the plurality of intermediate layer apertures between the die mold layers along each said runner grooves into the mold forming pockets in the die mold layers in the lower die sections;

providing separate semiconductor substrates with a plurality of semiconductor assemblies between each of said vertically stacked layers in the location of the mold forming pockets; and flowing molding compound through said top layer aperture and along said each of said runner grooves into the mold framing pockets and the substrate/leadframe in the top die mold section and from the top die mold section through die halls between stacked die layers along the runner grooves into the mold framing pockets to the other substrate/leadframes in lower die mold sections between lower stacked die layers.

2. The method of claim 1 wherein said flowing step includes a press rod for pressing the molding compound through said die hall in said top die layer.

* * * * *